United States Patent
Searls et al.

(10) Patent No.: US 6,752,635 B1
(45) Date of Patent: Jun. 22, 2004

(54) COMB-SHAPED LAND GRID ARRAY (LGA) SOCKET CONTACT FOR IMPROVED POWER DELIVERY

(75) Inventors: Damion T. Searls, Hillsboro, OR (US); Thomas G. Ruttan, Lake Oswego, OR (US); Jiteender P. Manik, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/404,299

(22) Filed: Mar. 31, 2003

(51) Int. Cl.[7] .............................................. H01R 12/00
(52) U.S. Cl. ........................................ 439/71; 439/721
(58) Field of Search ............................ 439/68–73, 721, 439/723, 724

(56) References Cited

U.S. PATENT DOCUMENTS

| | | | | |
|---|---|---|---|---|
| 5,624,280 A | * | 4/1997 | Kato | 439/724 |
| 5,683,256 A | * | 11/1997 | Werther | 439/69 |
| 6,328,574 B1 | * | 12/2001 | Howell et al. | 439/70 |
| 6,383,035 B1 | * | 5/2002 | Kasai | 439/724 |
| 6,390,827 B1 | * | 5/2002 | Howell et al. | 439/70 |
| 6,575,766 B1 | * | 6/2003 | Xie et al. | 439/70 |

* cited by examiner

*Primary Examiner*—Ross Gushi
(74) *Attorney, Agent, or Firm*—Blakely, Sokoloff, Taylor & Zafman LLP

(57) ABSTRACT

A conventional land grid array (LGA) socket assembly uses the same socket contact in the power delivery area and the signal delivery area. Using low current socket contacts in the power delivery area may create self-heating and limit power delivery from a printed circuit board (PCB) to an IC package mounted in the socket. Embodiments of the present invention are directed to an LGA socket assembly that has a separate power delivery contact, which includes contact pins and contacts pads that are ganged using a cross beam to form a comb-shaped contact. In an alternative embodiment of the present invention, an LGA socket assembly has a shorter channel in the power delivery area than in known LGA socket assemblies. In still another embodiment, an LGA socket assembly has a shorter channel in the power delivery area in the signal delivery area.

19 Claims, 4 Drawing Sheets

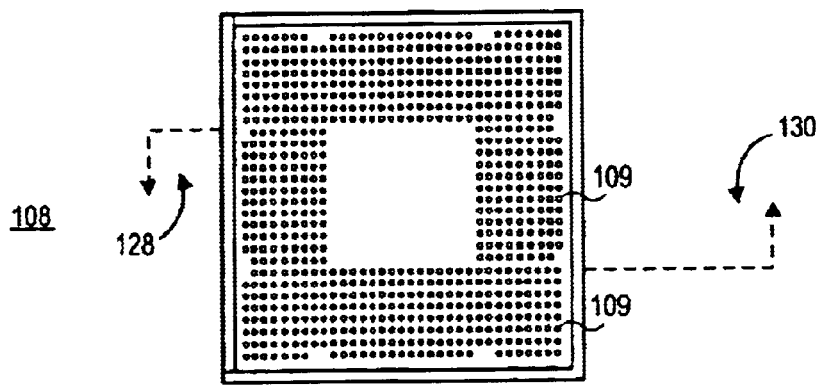
FIG. 1D
(PRIOR ART)
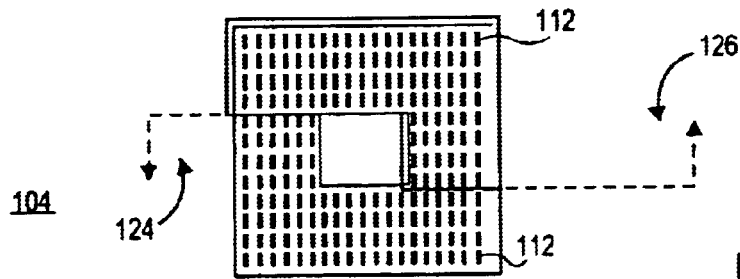
FIG. 1B
(PRIOR ART)
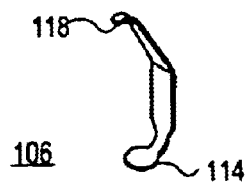
FIG. 1C
(PRIOR ART)
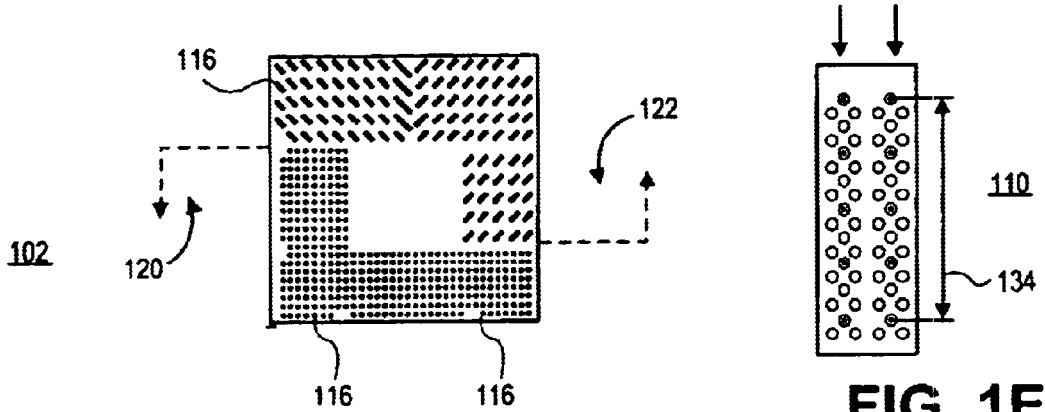
FIG. 1A
(PRIOR ART)
FIG. 1E
(PRIOR ART)

COMB-SHAPED LAND GRID ARRAY (LGA) SOCKET CONTACT FOR IMPROVED POWER DELIVERY

BACKGROUND

1. Field

Embodiments of the present invention relate to sockets for coupling integrated circuits to printed circuit boards, and in particular to land grid array (LGA) sockets having separate geometries for power delivery and signal contacts.

2. Discussion of Related Art

A land grid array (LGA) socket is a common connector used to couple an integrated circuit (IC) package to a printed circuit board (PCB. FIGS. 1A through 1E show an exploded view of a typical known LGA IC package-socket-PCB assembly 100.

FIG. 1A shows a printed circuit board (PCB) 102, FIG. 1B shows the top side (IC package side) of an LGA socket body 104. LGA contacts 106 shown in FIG. 1C fit into the socket body 104. FIG. 1D shows the IC package 108 as viewed from above as though looking through the IC package 108. FIG. 1E shows details of a portion 110 of the PCB 102. The socket assembly (i.e., the socket body 104 with the contacts 106 inserted), which is shown as a bottom view, is soldered to the PCB 102, which is shown as a top view. The IC package 108 mounts to the top side of the socket body 104.

The contacts 106 fit into slots 112 on the socket 104. Each contact 106 has a contact pad 114 that is soldered to a corresponding solder pad 116 on the PCB 102. Each contact 106 also has a contact pin 118 that mates to corresponding lands 109 on the IC package 108.

The PCB 102 has a signal delivery area 120 and a power delivery area 122. The socket body 104 has a signal delivery area 124 and a power delivery area 126. The IC package 108 has a signal delivery 128 area and a power delivery area 130. Each of the signal delivery areas corresponds to the other signal delivery areas such that input/output (I/O) signals (such as data and address signals) coming from signal planes in the PCB are electrically coupled to the appropriate solder pad 116, contact 106, and socket body 104 land. Likewise, each of the power delivery areas corresponds to the other power delivery areas such that power ($V_{CC}$) and ground ($V_{SS}$) coming from power and ground planes in the PCB 102 are electrically coupled to the appropriate solder pad 116, contact 106, and socket body 104 land.

One characteristic of the conventional LGA IC package-socket-PCB assembly 100 is that the contact design in the power delivery areas is the same the contact design in the signal areas (i.e., the contact 106). The contacts in the power delivery areas do not have the same function as the contacts in the signal areas, however. For example, the contacts in the power delivery areas carry high currents and the contacts in the signal areas carry low currents. Increased current density through the contacts 106 positioned in the power delivery area 126 may create self-heating which may increase contact 106 resistance and limit power delivery to the IC package 108. As high performance components consume more power and current, electrical resistance of the contacts 106 may limit power delivery to such components.

An existing approach to reducing current density through the contacts 106 is to allocate more contacts 106 in the LGA IC package-socket-PCB assembly 100 for power delivery, i.e., increase the size of the power delivery area 126. Increasing the size of the power delivery area 126 reduces the size of the signal delivery area 126, however, which may mean that the number of contacts 106 available for signals is reduced.

Another existing approach is to add more contacts 106 to the assembly 100. More contacts 106 means that the socket assembly is larger, however, and that the IC package 108 is larger. Additionally, more contacts 106 generally requires greater IC package to socket insertion force in order to maintain an effective IC package to socket interface resistance. This greater insertion force can further complicate effective enabling design.

Another characteristic of the conventional LGA IC-socket-PCB assembly 100 is that the body of the socket 104 is made from injection-molded plastic and each slot 112 is injection molded. This introduces limitations on contact 106 spacing, which can also introduces limitations on PCB solder pad 116 spacing and IC package land 109 spacing. Also, if more pins are to be added, the individual parts of the LGA IC package-socket-PCB assembly 100 are more expensive.

The socket assembly portion 110 illustrates this point. The portion 110 includes channels 132. The channel 132 has a length 134 and a set of slots 112, lands 109, contacts 106, and solder pads 116. The channel 132 has a length of approximately 10.16 mm or more. Within that length the channel 132 has approximately eight to nine slots 112, lands 109, contacts 106, and solder pads 116. Also within that length the channel 132 has a pitch (e.g., slot 112-to-slot 112, land 109-to-land 109, and contact 106-to-contact 106) of approximately one millimeter (mm). Because of the slots 112 are injection molded individually, the LGA IC package-socket-PCB assembly 100 is so limited.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which:

FIGS. 1A through 1E illustrate of an exploded view of a known line grid array (LGA) socket assembly;

DETAILED DESCRIPTION OF THE ILLUSTRATED EMBODIMENTS

Figure 2A:
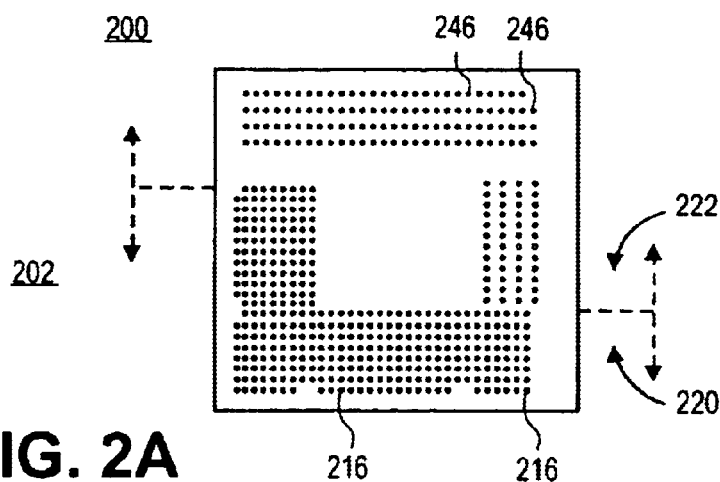
FIGS. 2A through 2E illustrate an exploded view of a LGA socket assembly according to an embodiment of the present invention.
Figure 2B:
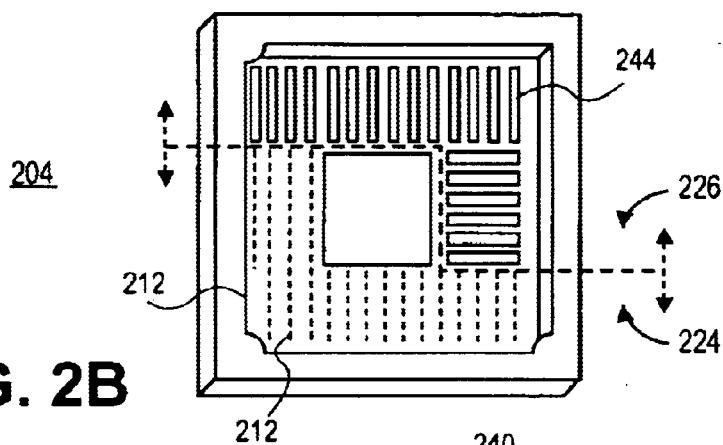
Figure 2C:
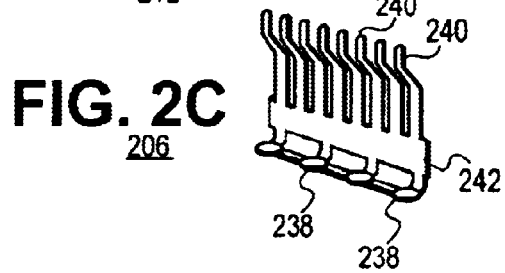
Figure 2D:
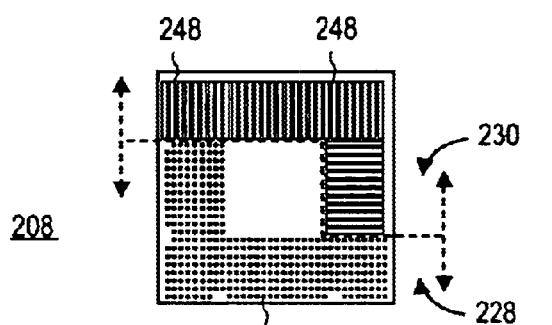
Figure 2E:
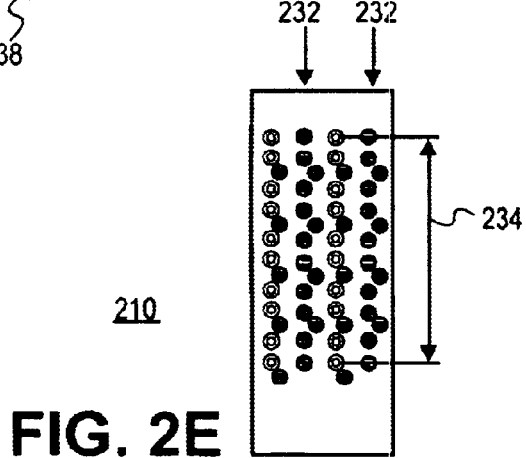

Embodiments of the present invention are directed to an LGA socket assembly that has its power delivery area and signal delivery area segregated based socket contact design. The contacts positioned in the signal delivery area may be known LGA contacts. The contacts positioned in the power delivery area are comb-shaped contacts according to embodiments of the present invention in which the contact pins and pads are ganged together using a cross beam. The result is an LGA socket assembly with shorter channels, tighter pitches, lower contact resistances, higher current carrying and power delivery capabilities, and potentially a lower pin/pad counts than in known LGA socket assemblies.

FIG. 2 is an exploded view of an LGA IC package-socket-PCB assembly 200 according to an embodiment of the present invention. FIG. 2A shows a printed circuit board (PCB) 202. FIG. 2B shows the top side (IC package side) of the LGA socket body 204. LGA contacts 106, shown in FIG. 1C, and 206, shown in FIG. 2C, fit into the socket body 204. FIG. 2D shows the IC package 208 as viewed from above and as though looking through the IC package 208. FIG. 2E shows a portion 210 of the PCB 202. The socket body 204, which is shown as a bottom view, is soldered to the PCB 202, which is shown as a top view. The IC package 208 mounts to the top side of the socket body 204.

The socket body 204 may be made from injection-molded plastic according to embodiments of the present invention using known injection-molding techniques. The PCB 202 may be any substrate suitable for mounting an LGA socket according to an embodiment of the present invention.

The PCB 202 has a signal delivery area 220 and a power delivery area 222. The socket body 204 has a signal delivery area 224 and a power delivery area 226. The IC package 208 has a signal delivery 228 area and a power delivery area 230. Each of the signal delivery areas correspond to the other signal delivery areas such that input/output (I/O) signals such as data and address signals coming from signal planes in the PCB 202 (e.g., through a particular PCB 202 via) is electrically coupled to the appropriate solder pad 216, contact 206, and socket body 204 land. Likewise, each of the power delivery areas correspond to the other power delivery areas such that power ($V_{CC}$) and ground ($V_{SS}$) coming from power and ground planes in the PCB 202 (e.g., through a particular PCB 202 via) is electrically coupled to the appropriate solder pad 216, contact 206, and socket body 204 land.

The solder pads 216 are in the signal delivery area 220, slots 212 are in the signal delivery area 224, and the lands 209 are located in the signal delivery area 228. A single contact 106 fits into a single slot 212, solders to a single solder pad 216, and mates with a single land 209.

The contact 206 includes at least one contact pads 238 and at least two contact pins 240 ganged using a crossbeam 242 to give the contact 206 a comb shape. The contact 206 fits into a slot 244 in the power delivery area 226 of the socket body 204, solders to a solder pad 246, and mates with a single land 248.

In one embodiment, the contact 206 may be fabricated differently from the fabrication of known LGA contacts such as the contact 106. For example, in known contact 106 fabrication techniques, the springing action for each contact 106 is formed separately for each individual contact 106 and a certain amount of room is needed to be able to form the contact pins 118 and to have the springing action of each individual contact pin 118.

In embodiments of the present invention, the springing action of each contact pin 240 may be formed simultaneously during contact 206 fabrication. Because of the common bond at the base (i.e., the crossbeam 242), the contact pins 240 are much closer together than known contacts 106 when assembled (e.g., closer than 1.0 mm apart). In one embodiment, the contact pins 240 are spaced 0.5 mm apart. After reading the description herein a person of ordinary skill in the relevant art will readily recognize how to implement various embodiments of the present invention using different contact pin 240 spacing.

In one embodiment, the pitch of the contact pins 240 is smaller than the pitch of the contact pins 118 in the same space. For example, the pin-to-pin pitch of the contact pins 240 positioned in one slot 244 maybe less than approximately 1.27 mm. Alternatively, the pin-to-pin pitch of the contact pins 240 positioned in one slot 244 may be less than approximately 1.0 mm. Alternatively still, the pin-to-pin pitch of the contact pins 240 positioned in one slot 244 may be less than approximately 0.8 mm. Of course, other pitches for the contact 206 are possible and after reading the description herein a person of ordinary skill in the relevant art will readily recognize how to implement various contact 206 pitches in accordance with embodiments of the present invention.

In another embodiment, the number of the contact pins 240 within a given space in the socket 204 is greater than the number of the contact pins 118 in the same space. For example, approximately eight contact pins 240 may be positioned in one slot 244 whereas only four contact pins 118 may be positioned in four slots 212 occupying the same amount of space. Of course, other pin counts are possible when fabricating contacts 206 according to embodiments of the present invention. The number of contact pins 240 per contact 206 may vary depending on the particular application or fabrication process. After reading the description herein, a person of ordinary skill in the relevant art will readily recognize how to implement embodiments of the present invention for various contact pin counts.

In one embodiment of the present invention, the contacts 206 are optimized for power delivery. For example, the contacts 206 have a higher current capability than the contacts 106. To illustrate, in one embodiment, the contact 206 has a effective resistance R determined by the expression:

$$R = (\rho \times L)/A \qquad \text{Equation (1)}$$

where $\rho$ is a bulk resistivity of the contact 206 material, L is the effective length of the contact 206, and A is the effective cross-sectional conductive area of the set of contact pins 240 on a contact 206. Conductive area efficiency for a set of contact pins 240 may be defined as a total conductive cross-sectional area of the contact pins 240 on a contact 206 divided by a total cross-sectional area occupied by the set of the contact pins 240. In one embodiment, the total conductive cross-sectional area of the contact 206 is increased to reduce the total resistance of the contact 206. This may be accomplished by increasing the size of the crossbeam 242. Alternatively, this may be accomplished by changing the shape of the crossbeam 242.

The lands 248 on the IC package 208 are fabricated according to embodiments of the present invention to be compatible with the contact 206.

In one embodiment, the density of the contact pins 240 within a given space is greater than the density of the contact pins 118 in the same space. For example, there may be eight contact pins 240 for a given space (e.g., the length of a slot 244) as opposed to four contact pins 118 for the same amount of space (e.g., the length of four slots 212). The greater density reduces the path current has to travel in the power delivery areas. The assembled IC package-socket-PCB assembly 200 thus may have a reduced power delivery path resistance.

The contact 206 and slot 244 allow for a shortened channel in the IC package-socket-PCB assembly 200. The portion 210 of the IC package-socket-PCB assembly 200 shows channels 232, which have a length 234 of less than approximately 10.16 mm. In one embodiment, the channel 232 has a length 234 of approximately 8.89 mm. In an alternative embodiment, the channel 232 has a length 234 of approximately 6 mm. This reduces the effective PCB 202 resistance by shortening the length that current must travel to reach all the contacts 206. In the current art, it must travel solder pad 246-to-solder pad 246 approximately 10.16 mm. In embodiments of the present invention, current travels six mm.

The size of the contact pins 240, lands 248, contact pads 238, and/or the solder pads 246 need not be changed to obtain the shortened channel 262. The shortened channel 232 may be accomplished by reducing the distance between each contact pin 240 (e.g., by spacing the contact pins 240 closer together than permitted by conventional IC package-socket-PCB assembly 100 injection-molded technology). Of course, the channel 232 may have other lengths. After reading the description herein, a person of ordinary skill will readily recognize how to fabricate channels of various lengths.

There is no set ratio of contact pins 240 to contact pads 238. In one embodiment, the number of contact pins 240 is greater than the number of contact pads 238. In an alternative embodiment, the number of contact pins 240 is equal to the number of contact pads 238. The ratio of contact pads 238 to contact pins 240 may be determined based on the particular application, including the length of the channel 232, the contact pad 238 pitch, solder self-heating tolerances, contact pad 238 manufacturability, etc.

The number of contact pads 238 determines the number of solder pads 246, i.e., the number of solder pads 246 is equal to the number of contact pads 238. After reading the description herein a person of ordinary skill in the relevant art will readily recognize how to implement various embodiments of the present invention using different ratios of contact pads 238 to contact pins 240 and concomitant numbers of solder pads 246.

Figure 3:
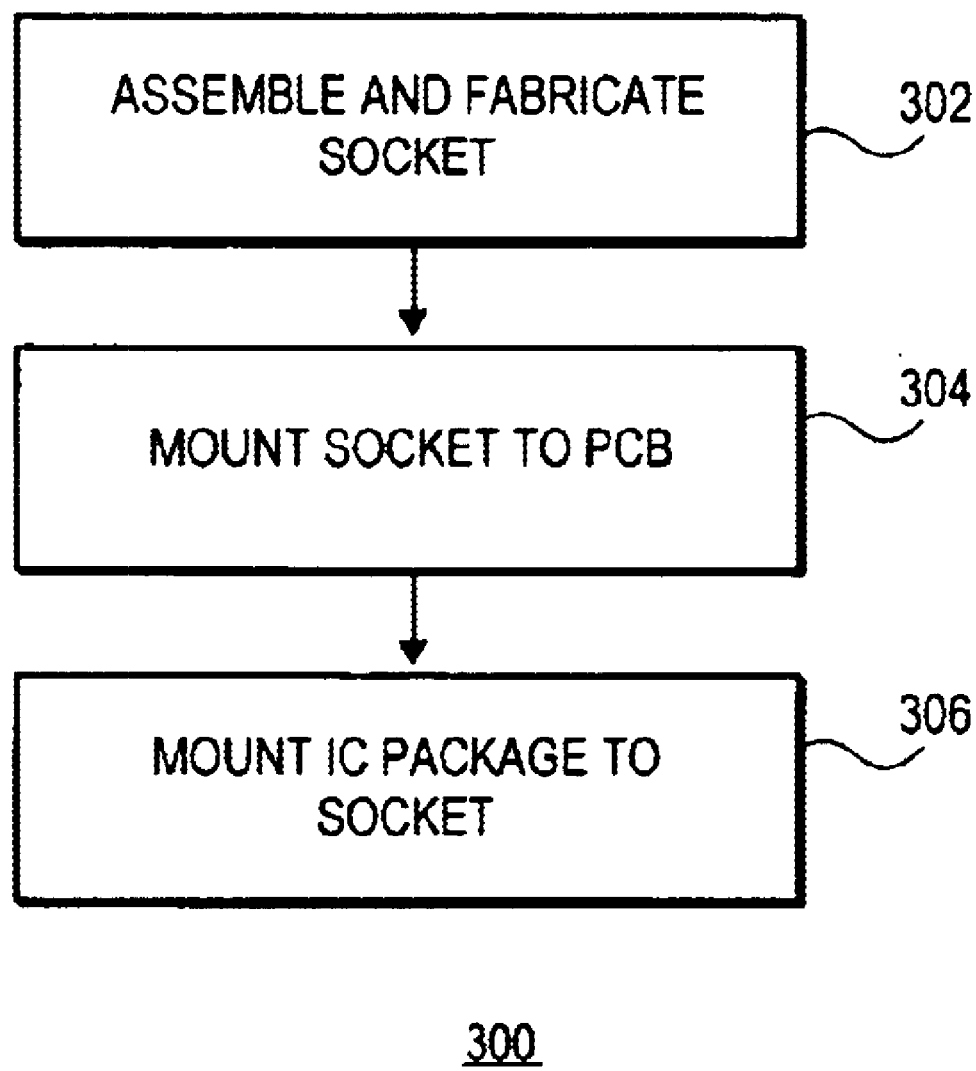
FIG. 3 is a flowchart of an approach to assembling an LGA socket assembly according to an embodiment of the present invention.

FIG. 3 is a flow diagram illustrating a process 300 for making the LGA IC package-socket-PCB assembly 200 according to embodiments of the present invention. A machine-readable medium with machine-readable instructions thereon may be used to cause a processor to perform the process 300. Of course, the process 300 is only an example process and other processes may be used.

In a block 302, the socket body 204 is fabricated and assembled. In one embodiment, the socket body 204, the slots 212 and 244 may be injection-molded, the contacts 106 are positioned in the slots 212, and the contacts 206 are positioned in the slots 244. The contacts 106 and 206 may be secured in place using any suitable well-known or proprietary technique.

In a block 304, the socket body 204 may then be mounted to the PCB 202. In one embodiment, the signal delivery area 224 is aligned with the signal delivery area 220 and the power delivery area 226 is aligned with the power delivery area 222. There may be solder balls attached to the bottoms of the contact pads 238 and solder paste on the surfaces of the solder pads 246. The socket body 204 is pressed onto the PCB 202 such that the solder balls come into contact with the solder paste. The solder paste holds the solder balls into place. The PCB 202 and the socket body 204 are placed into a solder re-flow oven to heat the solder to form an electrical connection between the socket body 204 and the PCB 202. The signal delivery are 224 is electrically connected to I/O signal plane on the PCB 202 and the power delivery area 226 is electrically connected to the power and ground planes on the PCB 202.

In a block 306, the IC package 208 may then be mounted in the socket body 204. The signal delivery area 228 is aligned with the signal delivery area 224 and the power delivery area 230 is aligned with the power delivery area 226. In one embodiment, the IC package 208 compression may be used to ensure that the lands 248 mate with the contact pins 240. When the lands 248 are mated with the contact pins 240, the signal delivery are 228 is electrically connected to I/O signal plane on the PCB 202 and the power delivery area 230 is electrically connected to the power and ground planes on the PCB 202.

Figure 4:
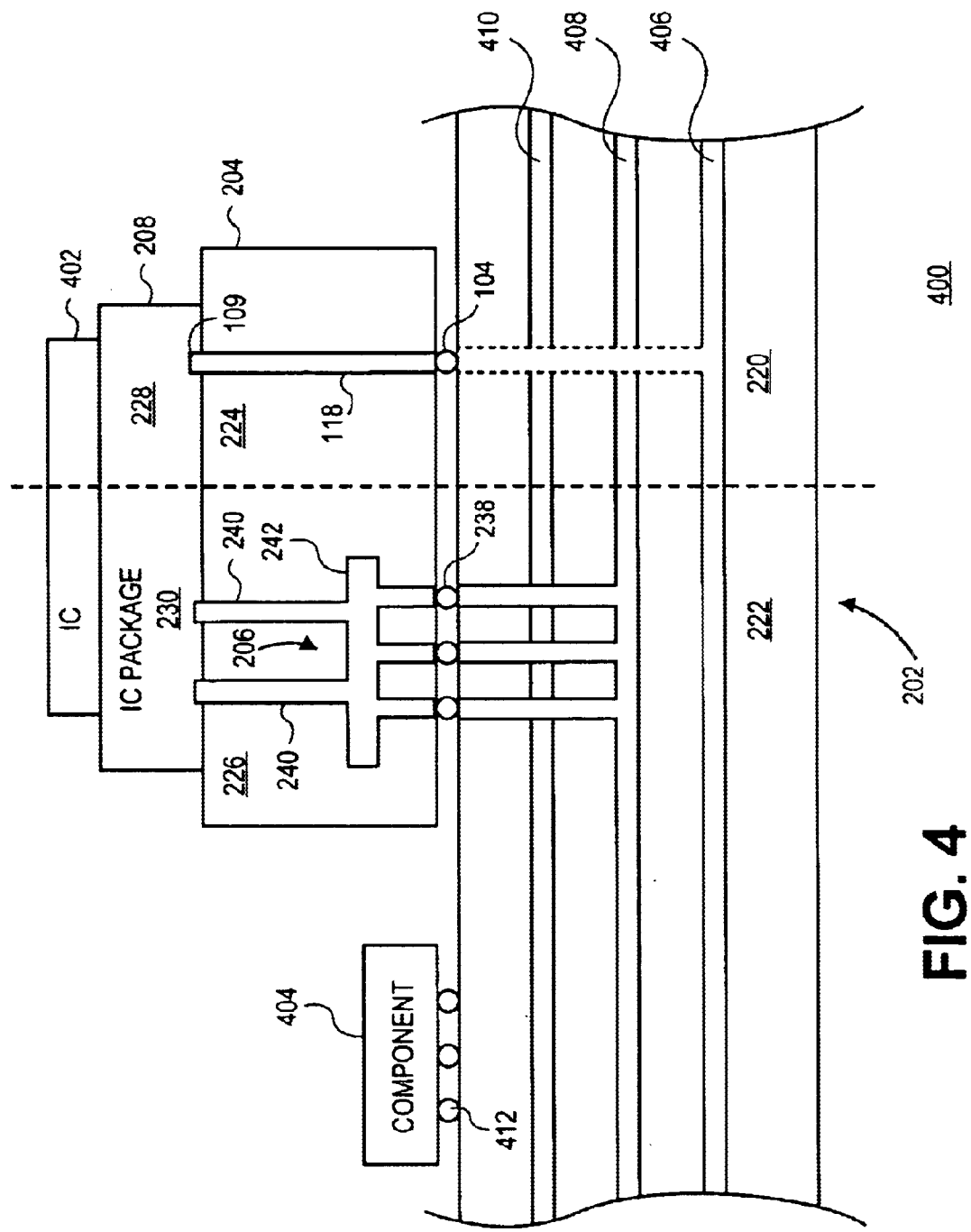
FIG. 4 is a high-level block diagram of a system according to embodiments of the present invention.

FIG. 4 is a high-level block diagram of a system 400 according to embodiments of the present invention. The example system 400 includes the PCB 202, the socket 204 mounted on the PCB 202, the IC package 208 mounted in the socket body 204, an IC 402 mounted in the IC package 208, and component 404. The PCB 202 includes a signal plane 406, a power plane 408, and a ground plane 410. The component 404 may have solder balls 412 so the component 404 can be mounted to the PCB 202 using known or proprietary techniques. In one embodiment of the present invention, the component 404 is a ball grid array (BGA) component. In an alternative embodiment, the component 404 may be a discrete component, such as a resistor, capacitor, etc.

The signal plane 406 may be used to carry I/O signals, such as data and address signals. The power plane 408 may be used for power ($V_{CC}$) and the ground plane 410 may be used for ground ($V_{SS}$). The lands 209 are electrically connected to the power plane 408 and/or the ground plane 410. The lands 109 are electrically connected to the signal plane 406.

Embodiments of the invention can be implemented using hardware, software, firmware, or a combination of hardware and software. In implementations using software, the software may be stored on a computer program product (such as an optical disk, a magnetic disk, a floppy disk, etc.) or a program storage device (such as an optical disk drive, a magnetic disk drive, a floppy disk drive, etc.).

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

In the above description, numerous specific details, such as particular processes, materials, devices, and so forth, are presented to provide a thorough understanding of embodiments of the invention. One skilled in the relevant art will recognize, however, that the embodiments of the present invention can be practiced without one or more of the specific details, or with other methods, components, etc. In other instances, well-known structures or operations are not shown or described in detail to avoid obscuring the understanding of this description.

Various operations have been described as multiple discrete operations performed in turn in a manner that is most helpful in understanding embodiments of the invention. However, the order in which they are described should not be construed to imply that these operations are necessarily order dependent or that the operations be performed in the order in which the operations are presented.

Reference throughout this specification to "one embodiment" or "an embodiment" means that a particular feature, structure, process, block, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms used in the following claims should not be construed to limit the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An apparatus, comprising:
   a land grid array (LGA) socket body;
   a first slot formed in the socket body;
   a first contact positioned in the first slot, the first contact having only one contact pin;
   a second slot formed in the socket body; and
   a second contact positioned in the second slot, the second contact having a crossbeam, at least two contact pins attached to the crossbeam, and at least one contact pad attached to the crossbeam.

2. The apparatus of claim 1, wherein the second contact includes at least two contact pads.

3. The apparatus of claim 1, wherein the first contact includes a first cross-sectional area and the second contact includes a second cross-sectional area, the second cross-sectional area being greater than the first cross-sectional area.

4. The apparatus of claim 3, wherein the first contact includes a first resistance and the second contact includes a second resistance, the second resistance being less than the first resistance.

5. The apparatus of claim 1, wherein the first contact is located in a signal delivery area of the LGA socket and the second contact is located in a power delivery area of the LGA socket.

6. The apparatus of claim 5, wherein a first current handling capability of the first contact is less than a second current handling capability of the second contact.

7. An apparatus, comprising:
   land grid array (LGA) contact having a crossbeam, a set of contact pins attached to the crossbeam, and a set of contact pads attached to the crossbeam, wherein the set of contact pins include a pin-to-pin pitch of less than approximately 1.27 mm.

8. The contact of claim 7, wherein a number of contact pins in the set of contact pins is greater than a number of contact pads in the set of contact pads.

9. The contact of claim 7, wherein a number of contact pins in the set of contact pins is equal to a number of contact pads in the set of contact pads.

10. The contact of claim 7, wherein the contact includes a resistance R determined by a bulk resistivity of the contact material, a length of contacts pins, and cross-sectional conductive area of the contact pins.

11. The contact of claim 10, wherein the contact includes a conductive area efficiency for a determined by total conductive cross-sectional area of the contact pins divided by a cross-sectional area occupied by the contact pins.

12. A method, comprising:
    assembling a first set of contacts and a first set of slots for a land grid array (LGA) socket body; and
    assembling a second set of contacts and a second set of slots for the LGA socket body, the second set of contacts having a crossbeam, a set of contact pins attached to the crossbeam, and a set of contact pads attached to the crossbeam, wherein the set of contact pins includes a pin-to-pin pitch of less than approximately 1.27 mm.

13. The method of claim 12, further comprising positioning the first set of contacts in a signal delivery area of the LGA socket body.

14. The method of claim 12, further comprising soldering the assembled LGA socket to an printed circuit board (PCB).

15. The method of claim 14, further comprising mounting an integrated circuit (IC) package to the assembled LGA socket.

16. A system, comprising:
    a printed circuit board (PCB) having a power delivery area;
    a line grid array (1LGA) socket having contacts positioned in power delivery area slots and soldered to the PCB power delivery area, the contacts having a crossbeam, a set of contact pins attached to the crossbeam, and a set of contact pads attached to the crossbeam, wherein the set of contact pins includes a pin-to-pin pitch of less than approximately 1.27 mm;
    an LGA component mounted in the LGA socket; the IC package having a power delivery area pins to mate with the LGA socket power delivery area slots; and
    a ball grid array (BGA) component mounted to the PCB.

17. The system of claim 16, the LGA socket further comprising a signal delivery area separate from the power delivery area.

18. The system of claim 17, wherein the signal delivery area includes a contact positioned therein different from the comb-shaped contact.

19. The system of claim 17, wherein the slots in the power delivery include a length ranging from approximately six millimeters to less than approximately 10.16 mm.

* * * * *

UNITED STATES PATENT AND TRADEMARK OFFICE
CERTIFICATE OF CORRECTION

PATENT NO. : 6,752,635 B1
DATED : June 22, 2004
INVENTOR(S) : Searls et al.

It is certified that error appears in the above-identified patent and that said Letters Patent is hereby corrected as shown below:

Column 1,
Line 20, delete "(1C" and insert -- IC --.

Column 8,
Line 31, delete "(1LGA)" and insert -- (LGA) --.

Signed and Sealed this

Fourteenth Day of December, 2004

JON W. DUDAS
*Director of the United States Patent and Trademark Office*